United States Patent [19]

Lykam et al.

[11] Patent Number: 5,160,181

[45] Date of Patent: Nov. 3, 1992

[54] PICK-UP HEAD ASSEMBLY

[75] Inventors: Mark A. Lykam, San Jose; Minoru Akagawa, Fremont, both of Calif.

[73] Assignee: Intelmatec Corporation, Fremont, Conn.

[21] Appl. No.: 757,064

[22] Filed: Sep. 9, 1991

[51] Int. Cl.[5] .......................... B65G 47/24; B65G 47/91
[52] U.S. Cl. ..................................... 294/64.1; 29/743; 414/737
[58] Field of Search ............... 294/64.1, 65, 86.41, 294/87.1; 29/740, 743; 271/91; 414/627, 737, 744.3, 752; 901/40

[56] References Cited

U.S. PATENT DOCUMENTS

| | | | |
|---|---|---|---|
| 3,415,388 | 12/1968 | Hornlein et al. | 294/64.1 X |
| 4,119,211 | 10/1978 | Boyer et al. | 414/627 X |
| 4,370,092 | 1/1983 | Healy | 414/752 |
| 4,515,507 | 5/1985 | Asai et al. | 294/64.1 X |
| 4,753,004 | 6/1988 | Fujioka | 294/64.1 X |
| 4,860,438 | 8/1989 | Chen | 294/64.1 X |

*Primary Examiner*—Johnny D. Cherry
*Attorney, Agent, or Firm*—Heller, Ehrman, White & McAuliff

[57] ABSTRACT

A pick-up head module has two vertical tubes for picking up small objects such as ICs by suction. A mechanism is provided for rotating these two tubes around their own axes. The tubes are individually supported by two separate tables, one (first) rack gear being attached to one of these tables and two (second and third) rack gears being attached to the other. These three rack gears are all vertically oriented, the first and second rack gears being in a side-by-side relationship and the third rack gear being opposite therefrom. A pinion is provided so as to be controllably slidable in the direction of its axis, thereby selectably engaging either with the first and second rack gears or with the first and third gear.

5 Claims, 4 Drawing Sheets

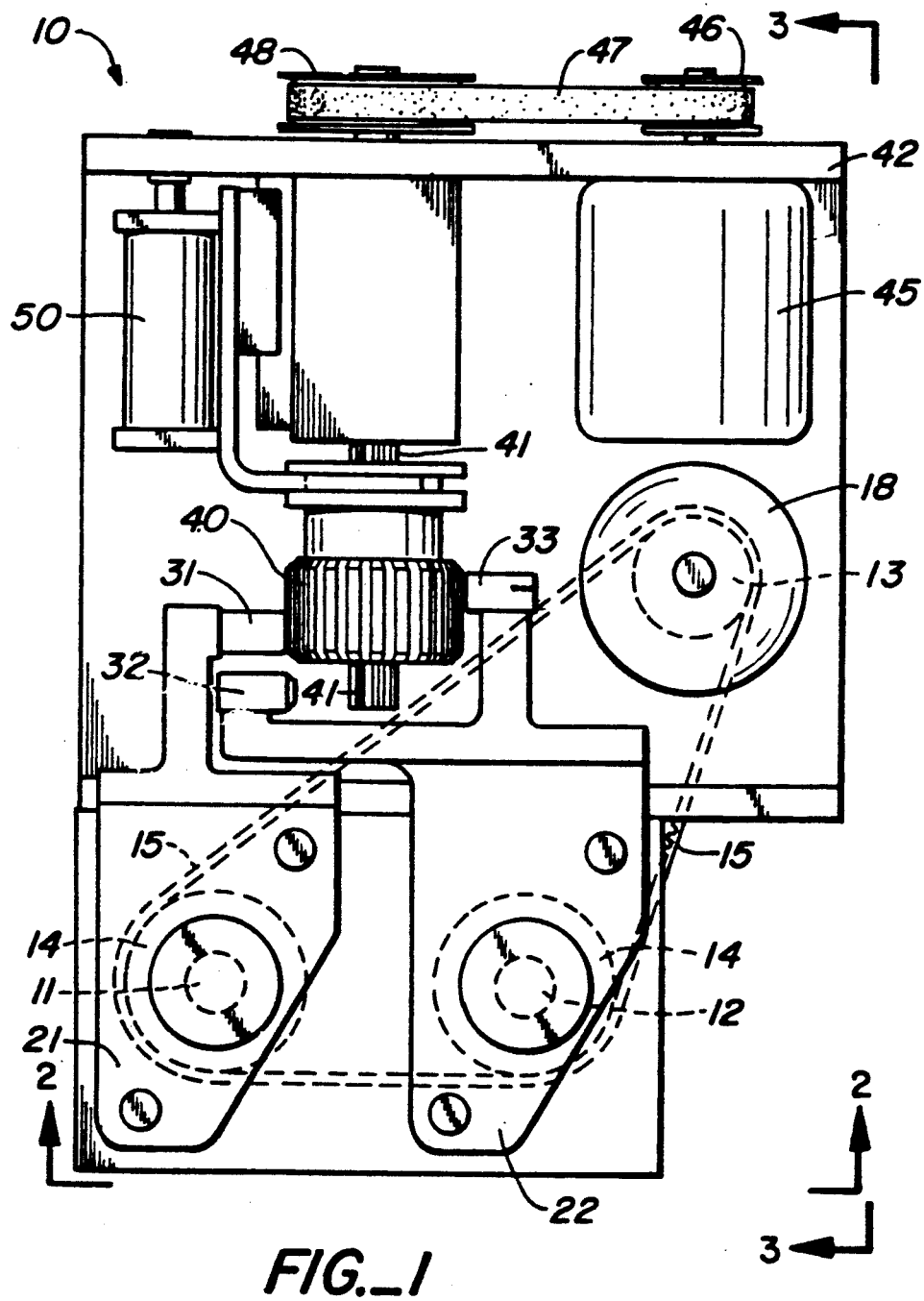
FIG._1

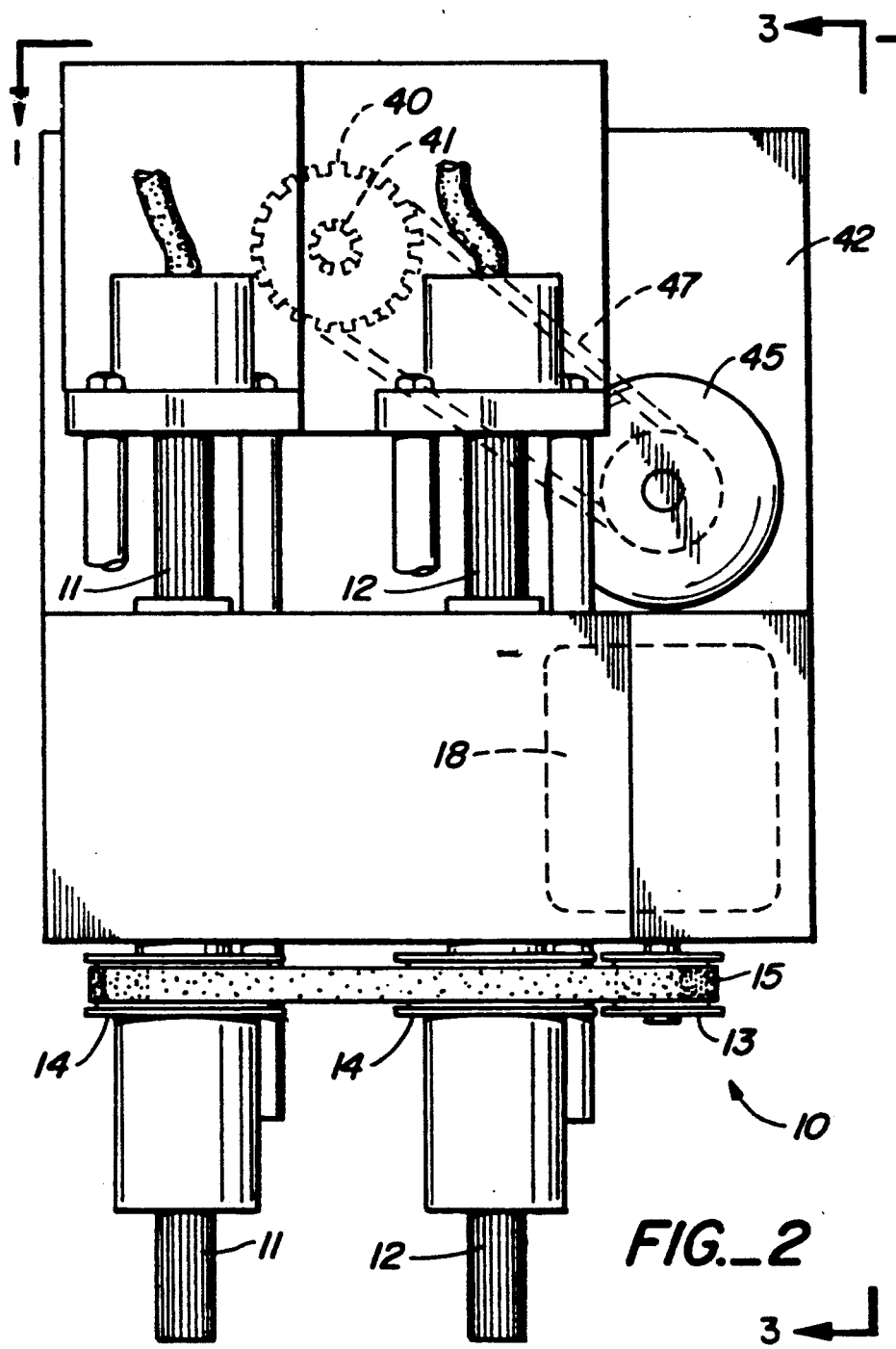
FIG._2

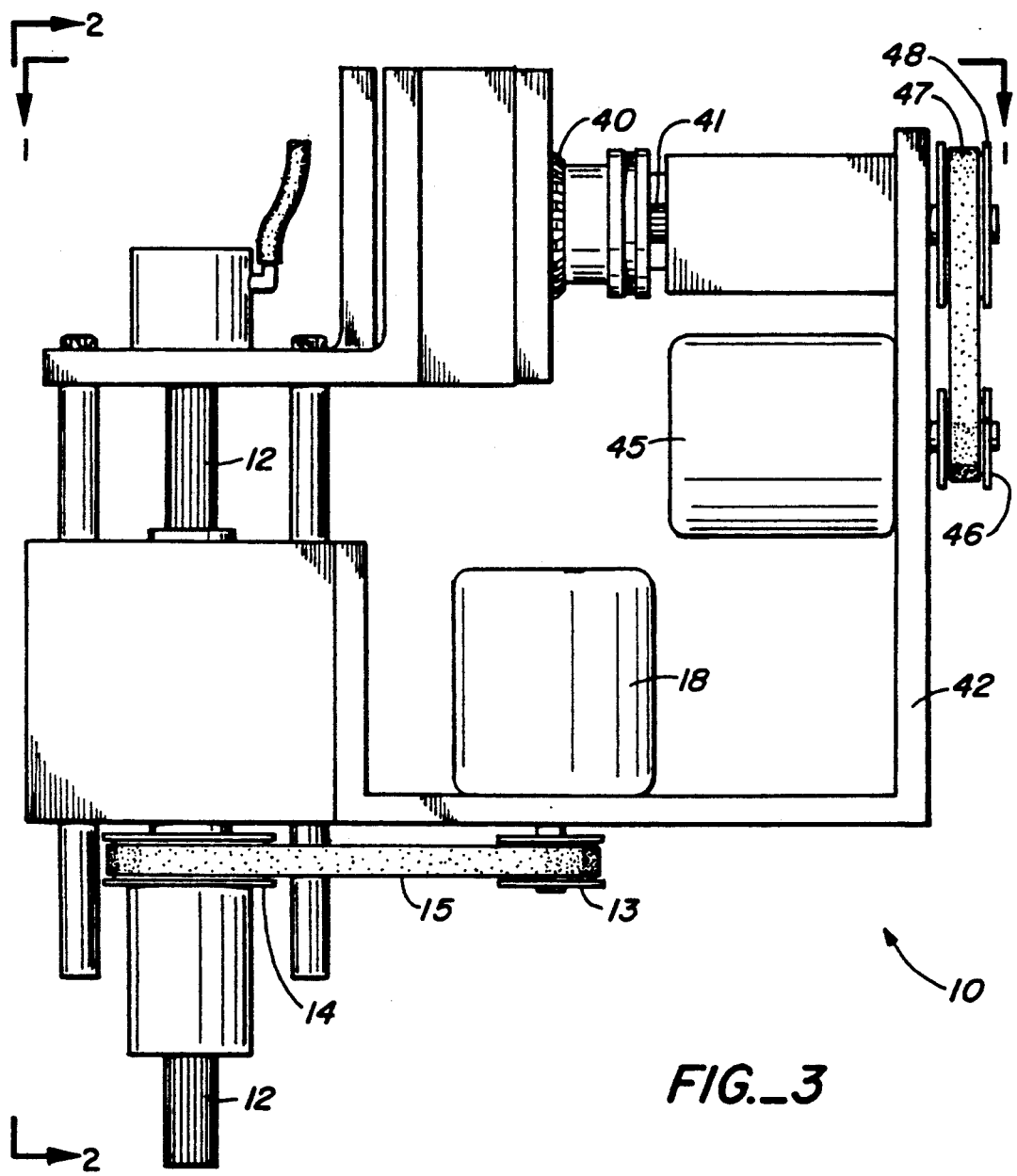
FIG._3

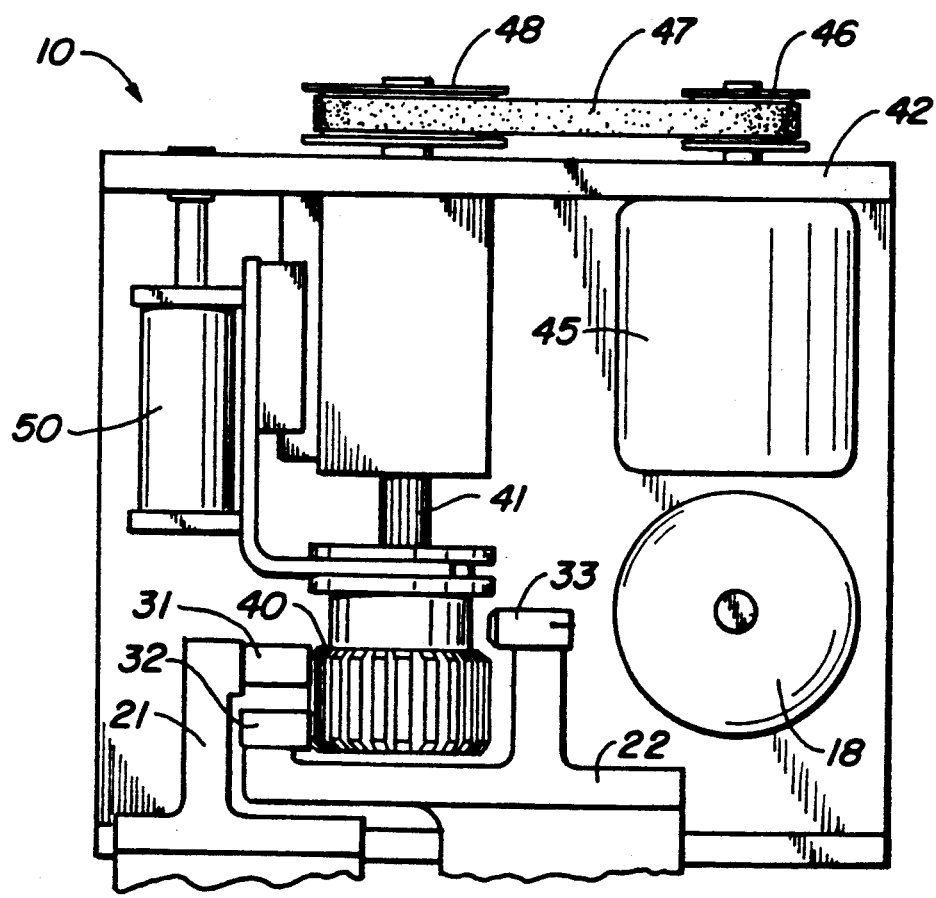
FIG._4

5,160,181

PICK-UP HEAD ASSEMBLY

BACKGROUND OF THE INVENTION

This invention relates to a pick-up head assembly, that is, an apparatus for picking up small objects such as ICs for transporting them by a short distance in order, for example, to unload them from a container and to deposit them at specified positions on circuit boards. More particularly, this invention relates to a pick-up head assembly which can pick up such small objects more efficiently.

Prior art pick-up head assemblies which are currently available commercially such as MT Series produced by Tenryu Technics, KC-800 produced by Juki Kabushiki Kaisha and YM66S produced by Yamaha Hatsudoki Kabushiki Kaisha are generally comprised of but one tubular member which is connected to a vacuum pump and is supported vertically and rotatable around its own axis such that a small object can be picked up by the negative pressure communicated through its hollow interior and deposited at a desired orientation by rotating the tube before releasing the object. For this purpose, there is also provided a mechanism for moving the tube vertically upward and downward.

With a prior art pick-up head assembly of this type, only one object such as an IC can be picked up at one time. In situations where there are a large number of objects to be individually picked up and transported, it is not efficient to pick them up only one at a time.

SUMMARY OF THE INVENTION

It is therefore an object of the present invention to provide a pick-up head assembly with improved efficiency.

It is another object of the present invention to provide a pick-up head assembly having two tubular members such that two small objects such as ICs can be picked up to be transported together.

It is still another object of the present invention to provide a pick-up head assembly capable of moving two tubular members up and down selectably either in phase or out of phase by 180° with respect to each other.

A pick-up head assembly embodying the present invention, with which the above and other objects can be accomplished, may be characterized as having two vertical tubular members, instead of one, for picking up small objects such as ICs by suction. A mechanism is provided for rotating these two tubular members around their own axes so that the orientations of the picked-up objects can be varied, and another mechanism is provided for moving them vertically up and down selectably either in phase such that they both move in the same direction together or out of phase by 180° such that they move in mutually opposite directions. The latter mechanism includes an axially slidable pinion and two separate tables which are vertically movable and to which these tubular members are individually affixed A (first) rack gear is attached vertically to one of these tables and two (second and third) vertical rack gears are similarly attached to the other table These three rack gears are so arranged that the first and second of them are in a side-by-side relationship while the third is nearly opposite to the first. This enables the pinion to be moved axially to a (first) position where the first and second rack gears engage with it from the same side or to another (second) position where the first and third rack gears engage with it from mutually opposite directions. If the pinion is rotated at the first position while engaging with the first and second rack gears, the two tables, and hence the two tubular members, move up and down together If the pinion is rotated at the second position while engaging with the first and third rack gears, the two tubular members move in mutually opposite directions.

BRIEF DESCRIPTION OF THE DRAWINGS

FIG. 1 is a plan view of a pick-up head assembly embodying the present invention with some components removed so as to show its general structure more clearly;

FIG. 2 is a front view of the pick-up head assembly of FIG. 1 taken along the line 2—2 with some components removed so as to more clearly show its general structure;

FIG. 3 is a side view of the pick-up head assembly of FIGS. 1 and 2 taken along the line 3—3 with some components removed so as to more clearly show its general structure; and FIG. 4 is a portion of FIG. 1 around the pinion when it is in a different engaging relationship with the rack gears from that shown in FIG. 1.

DETAILED DESCRIPTION OF THE INVENTION

With reference simultaneously to FIGS. 1, 2 and 3, there is shown a main part of a pick-up head assembly 10 embodying the invention, having two tubular splines 11 and 12 (which will be referred to for convenience as a first tubular spline and a second tubular spline, respectively) connected individually to a vacuum pump (not shown) so as to be able to pick up a small object such as an IC by suction. These tubular splines 11 and 12 are supported rotatably and individually by a first supporting plate 21 and a second supporting plate 22 such that the objects sucked to the bottom openings of the tubular splines 11 and 12 can be lifted or lowered as these supporting tables 21 and 22 are moved vertically upward or downward as will be described below. Two pulleys 14 of equal diameters engage individually around these tubular splines 11 and 12, and a timing belt 15 is stretched around these pulleys 14, connecting them to another pulley 13 affixed to the drive shaft of a tube-rotating motor 18. These pulleys 14 are slidable longitudinally along the extensions of the tubular splines 11 and 12 such that these tubular splines 11 and 12 can be rotated together at the same rate by the action of the tube-rotating motor 18, independently of the vertical positions of the tubular splines 11 and 12.

A rack gear 31 (herein referred to as the first rack gear) is affixed in a vertical orientation to the first supporting table 21, and two similar rack gears 32 and 33 (herein referred to respectively as the second rack gear and the third rack gear) are affixed vertically to the second supporting table 22. The first and second rack gears 31 and 32 are in a side-by-side relationship, while the third rack gear 33 is nearly opposite to the first rack gear 31. There is provided a spline shaft 41 which is rotatably supported in a horizontal direction by a bracket 42, and a pinion 40 is mounted to this spline shaft 41 so as to be rotatable therewith around its axis. The pinion 40 is also slidable longitudinally along the length of the spline shaft 41 so as to be able to selectably assume a longitudinal position along the spline shaft 41 (herein referred to as the first position) where it can engage simultaneously with both the first and second rack gears 31 and 32 while being disconnected from the third rack gear 33 as shown in FIG. 4, and another longitudinal position (referred to as the second position) where it can engage simultaneously with both the first and third rack gears 31 and 33 while being disconnected from the second rack gear 32 as shown in FIG. 1.

The bracket 42 also supports a pinion-rotating motor 45, of which the drive shaft is horizontal and parallel to the spline shaft 41. Pulleys 46 and 48 mounted respectively to the drive shaft of the pinion-rotating motor 45 and to the spline shaft 41 are in motion-communication relationship by means of another timing belt 47 which is stretched therebetween such that the pinion 40 can be rotated in a desired direction by activating the pinion-rotating motor 45. The pinion 40 may be moved between the first and second positions manually or by providing an air cylinder 50.

With a pick-up head assembly thus structured, small objects such as ICs can be efficiently picked up, for example, for loading, unloading and depositing. The two tubular splines 11 and 12 can be operated selectably in two modes. When it is desired to pick up two objects at the same time, the pinion 40 is set in the first position as shown in FIG. 4 so as to engage simultaneously with the first and second rack gears 31 and 32 and be disconnected from the third rack gear 33. If the pinion-rotating motor 45 is rotated in an appropriate direction, the rotary motion of its drive shaft is communicated to the spline shaft 41 through the pulleys 46 and 48 which are connected to each other by the timing belt 47, thereby causing the pinion 40 to rotate and lifting both the first and second supporting tables 21 and 22 to which the first and second tubular splines 11 and 12 are attached. With the vacuum pumps operating in the meantime, this allows two small objects to be picked up by suction by the two tubular splines 11 and 12. The vertical distance by which the picked-up objects are raised may be controlled by the angle of rotation of the pinion 40, that is, by that of the pinion-rotating motor 45.

The two objects thus picked up simultaneously by the pick-up head assembly 10 may be released either simultaneously or individually from the lower ends of the tubular splines 11 and 12. If they are to be deposited at positions separated by the same distance as the separation between the two tubular splines 11 and 12 and to be oriented in the same direction, the two tubular splines 11 and 12 may be rotated by the same angle by means of the tube-rotating motor 18. The vacuum pumps can be operated such that the objects are released from the tubular splines 11 and 12 either simultaneously or one at a time.

If the two objects picked up by the assembly 10 are to be deposited at locations separated from each other by a distance different from the separation between the two tubular splines 11 and 12, of if they are to be deposited in different orientations, they are released one by one, each time by adjusting the orientation of the object to b released by controllingly rotating the tubular splines 11 and 12 together by means of the tube-rotating motor 18.

In summary, if the objects such as ICs to be picked up are preliminarily arranged in two groups mutually separated at the same distance as the separation between the two tubular splines 11 and 12, two of them can be picked up simultaneously and delivered together to the neighborhood where they are to be released. Thus, even if they cannot be released simultaneously, depending on the configuration in which they are to be arranged, objects can be picked up, transported and deposited in a desired configuration with improved efficiency.

The invention has been described above by way of a single embodiment, but this embodiment is not intended to limit the scope of the invention. Any modifications and variations that may be apparent to a person skilled in the art are intended to be within the scope of the invention.

What is claimed is:

1. A pick-up head assembly comprising:
   a first vertical tube rotatably supported by a first supporting member;
   a second vertical tube rotatably supported by a second supporting member;
   a pinion supported by a spline shaft so as to be rotatable therewith and slidable therealong;
   a pinion rotating means for causing said pinion to rotate with said spline shaft;
   a first rack gear affixed to said first supporting member;
   a second rack gear parallel to said first rack gear and affixed to said second supporting member on the same side of said pinion as said first rack gear; and
   a third rack gear parallel to said first and second rack gears and affixed to said second supporting member on the opposite side of said pinion with respect to said first and second rack gears;
   said pinion being slidable along said spline shaft between a first position and a second position along said spline shaft, said pinion at said first position engaging with said first and second rack gear but not with said third gear such that rotation of said pinion causes said first and second vertical tubes to move vertically upward or downward together, said pinion at said second position engaging with said first and third rack gears but not with said second rack gear such that rotation of said pinion causes said first and second vertical tubes to move vertically up and down in mutually opposite directions.

2. The pick-up head assembly of claim 1 further comprising a tube rotating means for causing said vertical tubes to rotate around their own axes.

3. The pick-up head assembly of claim 2 wherein said vertical tubes have splined outer surfaces and said tube rotating means include pulleys which are individually mounted around said splined outer surfaces so as to be slidable along and rotatable with s id tubes and a belt which is stretched around said pulleys and connects said pulleys with a drive shaft of a tube-rotating motor.

4. The pick-up head assembly of claim 1 wherein said first, second and third rack gears extend vertically.

5. The pick-up head assembly of claim 1 wherein said pinion-rotating means include
   a pinion-rotating motor,
   pulleys mounted respectively to a drive shaft of said pinion-rotating motor and to said spline shaft, and
   a timing belt stretched over said pulleys so as to maintain said pinion-rotating motor and said spline shaft in a motion-communicating relationship.

* * * * *